United States Patent [19]

May et al.

[11] 4,357,544

[45] Nov. 2, 1982

[54] VARIABLE IMPEDANCE CIRCUIT

[75] Inventors: Klaus D. May, York, Pa.; Dana L. Eckstein, Ellicott City, Md.

[73] Assignee: Westinghouse Electric Corp., Pittsburgh, Pa.

[21] Appl. No.: 219,097

[22] Filed: Dec. 22, 1980

[51] Int. Cl.³ .......................................... H02M 3/145
[52] U.S. Cl. ...................................... 307/34; 323/270
[58] Field of Search ............................ 307/34, 33, 32; 323/270; 324/158 R

[56] References Cited

U.S. PATENT DOCUMENTS 3,458,801  7/1969  Polson ................................ 323/270

Primary Examiner—G. Z. Rubinson
Assistant Examiner—James L. Dwyer
Attorney, Agent, or Firm—J. B. Hinson

[57] ABSTRACT

The variable impedance circuit comprising the invention provides a circuit having an impedance which varies in response to an input signal. The invention utilizes a control circuit which samples the load current and compares it to the demand signal to generate a control signal. The control signal is coupled to a load driver circuit to cause the required current to flow through this circuit. The load driver circuit and one or more substantially identical load circuits are series coupled to form a variable impedance circuit having the desired voltage and current capability.

9 Claims, 2 Drawing Figures

VARIABLE IMPEDANCE CIRCUIT

BACKGROUND OF THE INVENTION

1. Field of the Invention

The invention relates to electronic circuits and more specifically to variable impedance electronic circuits which load a circuit to be tested to a specified current in response to an input signal.

2. State of the Prior Art

The preferred embodiment of the invention is intended primarily for use in testing high voltage power supplies by loading the power supply to be tested to a predetermined current level. In the prior art, such high voltage power supplies were normally tested with some type of passive resistance load element or a power triode tube. Such test circuits required extensive manual adjustments to achieve the necessary load conditions. This resulted in cumbersome testing procedures and bulky test equipment.

SUMMARY OF THE INVENTION

The preferred embodiment of the variable impedance circuit comprises a control circuit for generating a signal indicative of the desired load current and a signal indicative of the actual load current. These two signals are compared to each other to generate a signal which controls the load current.

The signal specifying the desired load current is coupled as an input signal to a load driver circuit causing this circuit to conduct a current of the desired value. One or more substantially identical load circuits are series coupled with the load driver circuit to provide a variable impedance circuit having the desired voltage rating between its high and low reference terminals.

DETAILED DESCRIPTION

Figure 1:
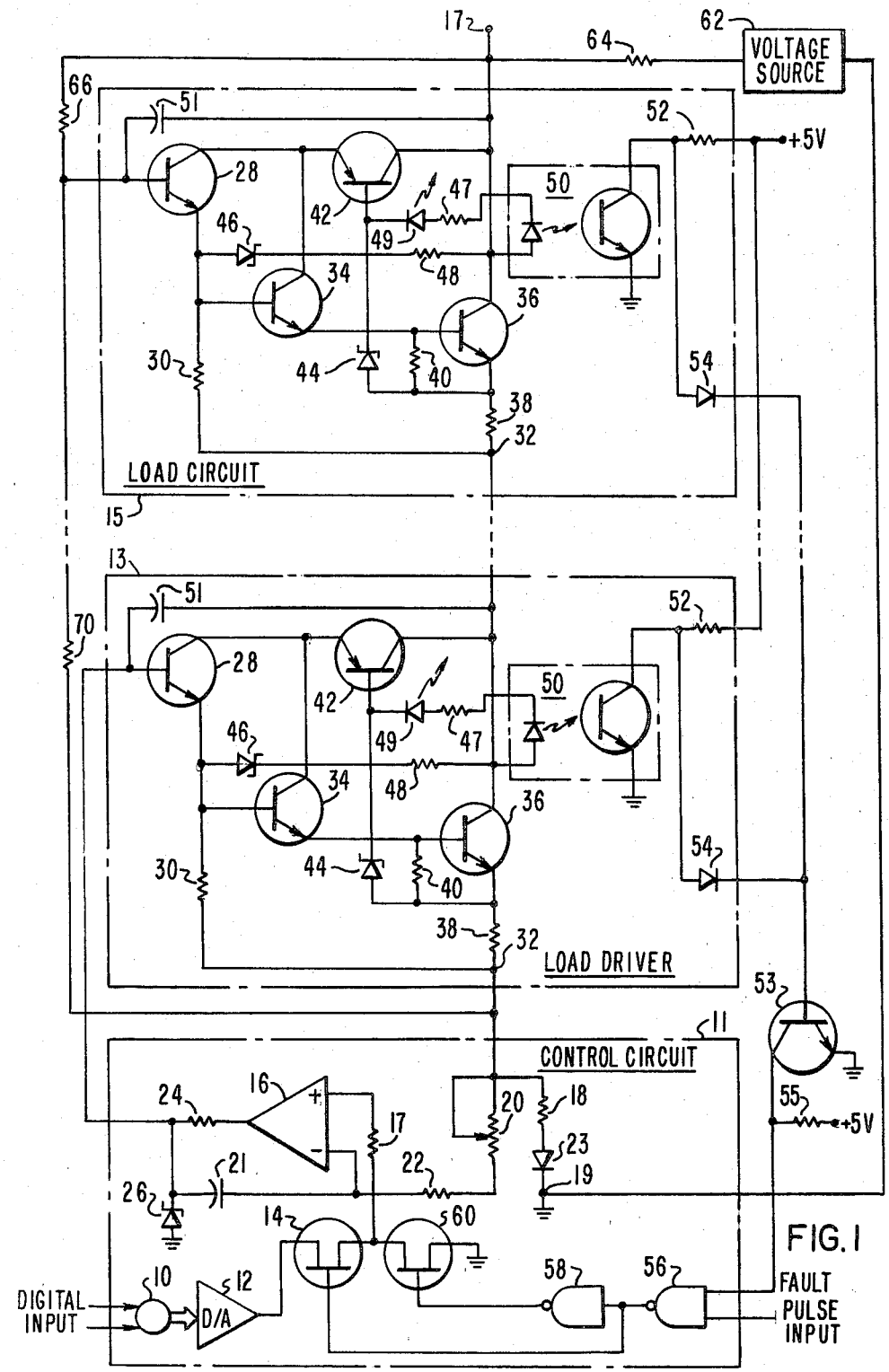
FIG. 1 is a schematic diagram of one embodiment of the invention.

FIG. 1 is a detailed schematic diagram of one embodiment of the invention. This embodiment comprises a control circuit 11, a load driver 13 and one or more substantially identical load circuits 15.

A multibit parallel digital signal specifying the desired load current level is coupled as an input to an optical isolator circuit 10. Electrical isolation between the high and low reference terminals of the variable impedance circuit and the system supplying the digital signal specifying the desired current is provided by optical isolators 10.

The digital output signal of the optical isolator 10 is coupled to the input of a digital-to-analog converter 12 to generate at the output of this A/D converter an analog signal indicative of the desired load current level. (Load current is defined as the current flowing at either the high or low reference terminals 17 and 19 of the variable impedance circuit.) A serial digital input signal could also be used if the digital to analog converter 12 includes suitable storage register.

A normally conducting MOS switch transistor 14 couples the output signal of the digital-to-analog converter 12 to the positive input terminal of an analog comparator circuit 16 through a resistor 17. A circuit consisting of a series coupled resistor 18 and a diode 23 is series coupled with the load current. A voltage proportional to the load current is generated across the resistor 18 and coupled to the negative input terminal of the comparator 16 through two series coupled resistors, 20 and 22, to generate at the output of this comparator a voltage proportional to the difference between the voltage across the resistor 18 and the output signal of the analog to digital converter 12. A series circuit consisting of a resistor 24 and a Zener diode 26 is series coupled between the output terminal of the comparator 16 and the low reference terminal of the variable impedance circuit to limit the voltage at the junction of resistor 24 and Zener diode 26. This voltage is used as a current control signal for the variable impedance circuit with the Zener diode 26 determining the maximum positive level of this signal and the resistor 24 limiting the current through the Zener diode 26 to prevent overloading of the comparator 16. High frequency feedback is provided by a capacitor 21 to stabilize the circuit.

In addition to the control circuit 11 described above, the variable impedance circuit includes a load driver circuit 13 and one or more substantially identical load circuits 15. In this embodiment, the load driver circuit 13 and the load circuits 15 are substantially identical except for the source of the input signal.

As described in more detail below, the input signal to the load driver circuit 13 is the current control signal. Input signals to the load circuits 15 are derived from a series resistor network which is connected in parallel with the series combination of the load driver 13 and load circuits 15. In practice, the voltage across the load driver 13 and each of the load circuits 15 is substantially equal with the number of load circuits used being selected to give the desired total operating voltage.

The following description of the load driver circuit 13 is equally applicable to the load circuit 15 except for the source of the input signal to the base of the first transistor. This identity is emphasized by using the same reference numerals to identify similar components of both circuits.

The current control signal appearing at the junction of the series connected resistor 26 and Zener diode 26, is coupled to the base terminal of an npn input transistor 28 of the load driver circuit 43. This transistor is connected in a common collector configuration to generate at its emitter terminal a voltage which is substantially equal to the current control signal at its base. A resistor 30 is coupled between the emitter of the input npn transistor 28 and the reference terminal 32 of the load driver circuit to provide a DC return for this transistor.

A second common collector amplifier comprising an npn transistor 34 has its base terminal coupled directly to the emitter terminal of the input transistor 28. A third high power npn transistor 36 has its emitter coupled to the reference terminal 32 through resistor 38 and its base terminal coupled directly to the emitter of the second transistor 34. Internal feedback is provided by the emitter resistor 38 to provide overall gain stabilization. A resistor 40 couples the base of the output transistor 36 to its emitter. This resistor reduces the impedance at the base terminal of the high power transistor 36 and improves the high frequency response of the circuit. Collector bias voltage is provided to the input transistor 28 and the second transistor 34 by a voltage source which comprises an npn transistor 42 and a Zener diode 44. This circuit provides a substantially constant voltage to the collector of the two input transistors with this voltage being available at the emitter of the regulator transistor 42. High frequency negative feedback to reduce high frequency noise is provided by a capacitor 51 connected between the output terminal and the base terminal of the input transistor 28.

Base drive is provided to the output transistor 36 by the combination of the two emitter follower transistors 28 and 34. As previously described, the output signal of the comparator circuit 16 is coupled to the base of the input transistor 28. This causes the drive to the output transistor 36 and the impedance of the load driver circuit 13 to change in response to the output signal of the comparator 16. A series circuit consisting of a Zener diode 46 and a resistor 48 provides sufficient drive independent of the drive to the input transistor 28 to limit the voltage across transistor 36 to prevent secondary breakdown.

The most likely failure mode for the output transistor 36 is a short circuit. Therefore, a monitoring circuit for shorts of this transistor was incorporated into the load circuit. The monitoring circuit includes an optically coupled transistor 50 which has its emitter coupled to the negative reference terminal of a five volt power supply and its collector coupled through a resistor 52 to positive reference terminal. The collector of the optically coupled transistor 50 is coupled through an isolation diode 54 to the base terminal of a transistor 53. During normal operation, the optically coupled transistor 50 will be bias on by series circuit consisting on a resistor 47 and a diode 49. This biases the isolation diode 54 and transistor 53 off indicating that the circuit is working normally.

The collector of transistor 53 is returned to the positive terminal of a plus five volt power supply through a resistor 55. Since the transistor 53 is biased off, the voltage at the collector of this transistor is approximately plus 5 volts. This voltage is coupled to one input of a gate circuit 56 to generate at the output of this gate a signal which turns on the MOS switching transistor 14. An inverter circuit 58 inverts the drive signal to the MOS switching transistor 14 to generate a signal which turns off a second MOS switching transistor 60.

If the output transistor 36 shorts, optical transistor 50 becomes non-conductive, biasing diode 54 on, turning on MPN transistor 53, turning off MOS switching transistor 14, and turns on MOS transistor 60. Turning on MOS switching 60 reduces the voltage at the positive input terminal of the comparator 16 to approximately zero volts and reduces the drive to turn off the load driver circuit.

A pulse input signal to the second input of the gate 56 provides a means for conveniently pulsing the variable impedance circuit on and off.

The load driver circuit described above is series coupled with one or more additional substantially identical load circuits to an external circuit. The external circuit will provide the voltage and current required by the variable impedance circuit. Developmental models of the invention used 74 individual load circuits to test a 15 kilovolt supply. Such a voltage supply, although not a part of the invention, is functionally illustrated at reference numeral 62. The high voltage power supply 62 will include some internal resistance. For purposes of illustration, the internal resistance of the high voltage power supply 62 is functionally illustrated as a fixed resistor at reference numeral 64. In any case, the combination of the voltage supply 62 must supply the proper operating current and voltage for the series combination of the load circuit driver circuit described above and the series coupled load circuits.

FIG. 1, for purposes of illustration, includes only load circuit, however, it should be emphasized that any number of load circuits may be utilized. The number utilized depends primarily on the output voltage of the power supply 62 with the normal voltage drop across the load circuits. In the embodiment illustrated in FIG. 1, the voltage drop across the load driver circuit and each of the load circuits is approximately 200 volts. However, it should be emphasized by selecting proper circuit components that other voltage drops across the individual load circuits could be utilized.

As previously explained, the load circuits 15 are substantially identical with the load driver circuit 13 except for the source of the input signal to the first transistor 28. Therefore, the same reference numbers are used to identify functionally identical components. Specifically, a DC bias is provided to the base terminal of the input transistor 28 of the load circuit by a bias circuit comprising 10 kilohm resistors 66 and 70. The value of resistor is chosen to draw a bias current which is low as compared to the normal operating current. However, the resistance must be low enough to provide sufficient current to the base of 28 under maximum load. For each additional load circuit used, a resistor must be added to the bias circuit with each junction formed by the resistors of the bias network serving as the input to one and only one load circuit.

A change in the impedance of the load driver circuit 13, as previously described, will also cause a change in the voltage between the base of the input transistor 28 and the reference terminal 32 of the load circuit 15. This causes a change in the drive to the output transistor 36 and adjust the impedance of the load circuit 15 to adjust to substantially the same impedance as the load driver circuit 13. Each load circuit utilized will operate in this manner with the total impedance being equal to the sum of the impedances of the load circuits 15 and the load driver 13.

A monitoring circuit is also included with each load circuits. The collector of each of the optical transistors 50 is coupled to the base of transistor 53 through the isolation diodes 54. This effectively couples all of the monitoring circuits in parallels to turn off the variable impedance circuit if the output transistor 36 of any of the load circuits or the load driver shorts.

Figure 2:
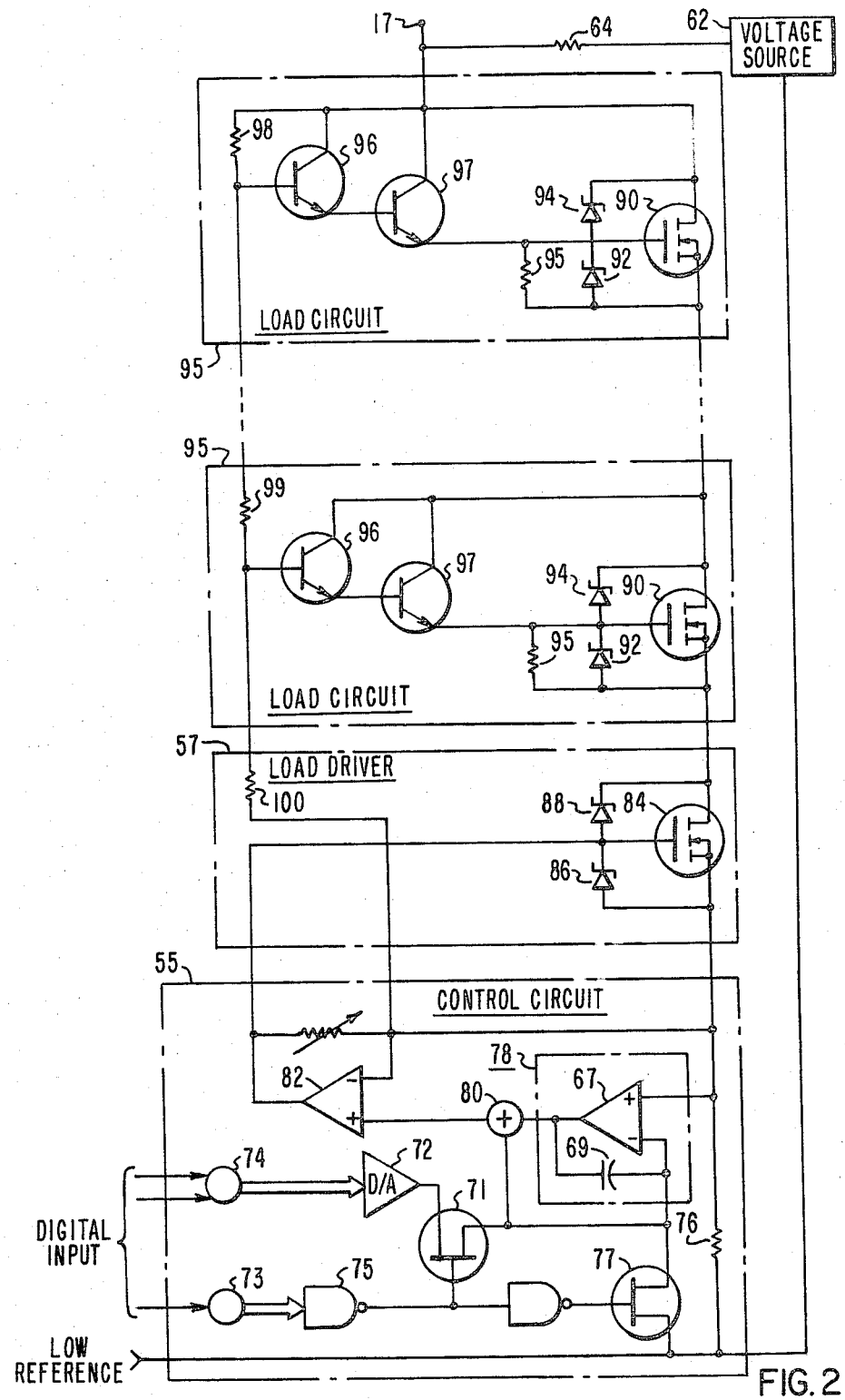
FIG. 2 is a schematic diagram of a second embodiment of the invention.

FIG. 2 is a second embodiment of the invention. This embodiment includes a control circuit 55, a load driver circuit 57, and one or more load circuits 59. This embodiment of the invention was also developed for the purpose of supplying a test load to a high voltage power supply. For purposes of illustration, this embodiment is illustrated coupled to test a power supply comprising a voltage source 62 having an internal resistance represented as a fixed resistor 64.

A parallel multi-bit digital signal specifying the desired current level is coupled to the input of an analog-to-digital converter 72 via an optical isolator 74. The output signal of the analog converter 72 is an analog signal specifying the desired current. An MOS switching transistor 71 couples the output signal of the analog-to-digital converter 72 to the input of an integrator 78, comprising an amplifier 67 and a capacitor 69, and to the input of an adder 80, in response to a digital signal coupled through a second optical isolator 73 and an amplifier 75. When the digital input signal to the optical isolator 73 changes state, the first MOS switching transistor 71 is turned off and the output signal of an inverter coupled to the gate of this MOS transistor changes state turning on a second MOS switching transistor 77. This couples the input terminals of the comparator 78 and the adder 80 to ground, turning off the variable impedance circuit.

The total current through the variable impedance circuit flows through current series resistor 76. The integrator 78 integrates the difference between the signal appearing across the resistor 76 and the output signal of the analog-to-digital converter 72. This signal is an error voltage and is added to the output of a digital-to-analog converter 72 by an adder circuit 80. An additional comparator 82 compares the output signal of the adder 80 with the voltage across the resistor 76 to produce at the output of this comparator a signal proportional to the desired current level. This signal is used as a drive signal to a load driver circuit 57.

The output signal of the comparator 82 is coupled to the gate of a high power field effect transistor 84 to cause this transistor to conduct the desired current level. Two Zener diodes 86 and 88 protect the field effect transistor 84 from excessive gate to source and gate to drain voltages. These diodes in conjunction with the field effect transistor 84 constitute a load driver circuit 57.

The load driver circuit 57 is series coupled with one or more identical load circuits 59 to produce a circuit capable of sustaining the desired voltage. Only two load circuits 59 are illustrated in FIG. 2 for reasons of convenience.

Each of the load circuits 59 includes an FET transistor 90 and two Zener diodes 92 and 94 protecting this transistor from excess voltages. The gate of the field effect driver transistor 90 is returned to the source through a resistor 95. Drive is provided to the gate of the field effect transistor 90 by two npn transistors 96 and 97 connected as a Darlington circuit. A resistor divider network comprising two identical resistors 98, 99 and 100 provides a bias voltage to the base of the first transistor 96.

A change in the impedance of the load driver circuit 57 in response to a change in the output signal of the comparator 82 cause a change in the potential between the source of the field effect transistor 84 and the base terminal of the input transistor 96. This results in a change in the gate voltage of the field effect transistor 84 and adjust the impedance of the load circuit 59 to a value substantially equal to the impedance of the load driver circuit 57. As in the previously discussed embodiment, the total impedance is the sum of the impedance of the load circuits 15 and the load driver 57.

Each additional load circuit is essentially identical to the two circuits illustrated in FIG. 2. These stages can be added to provide the desired net operating voltage, with the voltage across each of the load circuits typically being in the order of 200 volts.

The embodiment illustrated in FIG. 2 eliminates the concern about secondary breakdown of the output transistor. Considering the current state of the art, this embodiment may also have the highest switching speeds. Except for these considerations, these embodiments are functionally identical.

We claim:

1. A variable impedance circuit for loading a voltage source to a desired current, the magnitude of said desired current being specified by a demand signal, comprising in combination:
   (a) a control circuit for sensing the current loading of said voltage source and for comparing said sensed current to said demand signal to generate a control signal; said control circuit also including an optical isolator providing electrical isolation between said demand signal and the remainder of said variable impedance circuit
   (b) a load driver circuit responsive to said control signal to adjust the current through said load driver circuit to the value specified by said demand signal;
   (c) at least one load circuit series coupled with said load driver circuit, said at least one load circuit being responsive to the voltage drop across the series combination of said load driver circuit and said at least one additional load circuit to provide a current through the series combination of said load driver circuit and said at least one load circuit substantially equal to the current specified by said current demand signal, and a substantially equal voltage drop across said load driver circuit and each of said at least one additional load circuits.

2. A variable impedance circuit in accordance with claim 1 wherein said control circuit also includes means responsive to a digital input signal to switch said current through a load between substantially zero and said value specified by said current demand signal.

3. A variable impedance circuit in accordance with claim 2 wherein said control circuitry includes:
   (a) an analog comparator having first and second inputs;
   (b) means for coupling a voltage proportional to said current to said first input;
   (c) switching means for selectively coupling said first input to an analog voltage proportional to said current demand signal and to a reference potential thereby causing said current to be pulsed.

4. A variable impedance circuit in accordance with claim 3 wherein each of said at least one additional load circuits comprises a common collector input transistor coupled to drive an output transistor, with said output transistor including a resistor in series with its emitter to provide internal feedback to stabilize the gain of said at least one additional load circuit.

5. A variable impedance circuit in accordance with claim 1 wherein said control circuit includes an integrator responsive to a voltage proportional to said sensed current and a voltage proportional to said demand signal to generate an output signal equal to the integral of the difference between these signals.

6. A variable impedance circuit in accordance with claim 5 wherein said control circuit includes an adder for adding said output signal to said voltage proportional to said demand signal.

7. A variable impedance circuit in accordance with claim 6 further including a comparator for comparing the output signal of said adder to a signal proportional to the current flowing through said variable impedance circuit to generate a current control signal.

8. A variable impedance signal in accordance with claim 7 wherein said output control signal is coupled to the gate terminal of a field effect transistor which comprises a load driver circuit.

9. A variable impedance circuit in accordance with claim 8 wherein each of said load circuits comprises a field effect output transistor driven by a Darlington circuit.

* * * * *